United States Patent [19]

Nakashiba

[11] Patent Number: 5,384,482
[45] Date of Patent: Jan. 24, 1995

[54] SEMICONDUCTOR INTEGRATED CIRCUIT DEVICE HAVING INPUT PROTECTIVE CIRCUIT

[75] Inventor: Yasutaka Nakashiba, Tokyo, Japan

[73] Assignee: NEC Corporation, Tokyo, Japan

[21] Appl. No.: 63,917

[22] Filed: May 18, 1993

[30] Foreign Application Priority Data

May 18, 1992 [JP] Japan .................. 4-124811

[51] Int. Cl.⁶ ............. H01L 27/04; H01L 27/12
[52] U.S. Cl. .................... 257/547; 257/509; 257/544; 257/546
[58] Field of Search ............. 257/509, 544, 546, 547

[56] References Cited

U.S. PATENT DOCUMENTS

| 4,739,378 | 4/1988 | Ferrari et al. | 257/546 |
| 4,897,757 | 1/1990 | Tailliet et al. | 361/91 |
| 5,208,474 | 5/1993 | Yamagata et al. | 257/356 |
| 5,223,737 | 6/1993 | Canclini | 257/546 |
| 5,247,201 | 9/1993 | Becker | 257/546 |

Primary Examiner—Andrew J. James
Assistant Examiner—Valencia Martin Wallace

[57] ABSTRACT

An input protective circuit provided between a semiconductor integrated circuit and an input bonding pad formed on a semiconductor substrate includes an N or P type electric field intensity relaxing region for setting a clamp level of the input protective circuit. The electric field intensity relaxing region is formed between an N⁺-type semiconductor region connected to an input wiring layer and a P⁺-type semiconductor region connected to a reference potential wiring layer.

18 Claims, 6 Drawing Sheets

SEMICONDUCTOR INTEGRATED CIRCUIT DEVICE HAVING INPUT PROTECTIVE CIRCUIT

BACKGROUND OF THE INVENTION

Field of the Invention

The present invention relates to a semiconductor integrated circuit device having an input protective circuit and, more particularly, to an improvement in an input protective circuit including a diode.

In order to protect a semiconductor integrated circuit against external electrostatic noises and/or high abnormal voltages applied accidentally thereto, it is usual to connect a diode to an input bonding pad of the semiconductor integrated circuit as an input protective circuit. A plan view of an example of a conventional input protective circuit is shown in FIG. 1A. FIG. 1B is a cross section taken along a line B—B in FIG. 1A.

In FIGS. 1A and 1B, an input bonding pad 2 and an input wiring layer 3, both being made of aluminum, are formed on an insulating film (not shown) covering a P-type semiconductor substrate 1 on which a semiconductor integrated circuit (not shown) is formed. The input wiring layer 3 is elongated to an input contact of the semiconductor integrated circuit provided behind these elements on FIG. 1A or below these elements on FIG. 1B. Further, a reference potential wiring layer 13 made of aluminum is also formed on the semiconductor substrate for supplying a reference potential (for example, ground potential: GND) to various circuit elements. An N+-type semiconductor region 44 of high impurity density included in the semiconductor integrated circuit is connected through contact holes 11 to a branching region of the input wiring layer 3, and a P+-type semiconductor region 45 of high impurity density is connected through other contact holes 11 to branching regions of the reference potential wiring layer 13. A diode 46 is thus formed by a PN junction 46 between the N+-type semiconductor region 44 and the P+-type semiconductor region 45. An equivalent circuit of the input protective circuit 40 shown in FIGS. 1A and 1B is shown in FIG. 1C.

Usually, if an excessive electric field is applied to a gate electrode arranged in a location corresponding to an input contact of a semiconductor integrated circuit having no input protective circuit, a gate insulating film which is formed below the gate electrode and is as thin as several tens nm may be broken down, leading to operational failure of the semiconductor integrated circuit. However, when such abnormally high voltage is applied to the input bonding pad 2 through the input protective circuit as shown in FIGS. 1A to 1C, it is clamped by the protective diode 46 so that electric field strength applied to the gate electrode can be reduced and thus break-down of the gate insulating film is prevented.

However, in the conventional input protective circuit of the semiconductor integrated circuit mentioned above, a clamp level or break-down voltage value of the PN junction diode against high abnormal voltage depends upon impurity densities of the N-type and P-type semiconductor regions 44 and 45. The semiconductor regions 44 and 45 are formed simultaneously with the formation of N+-type semiconductor regions and P+-type semiconductor regions in a semiconductor circuit region, for providing ohmic contacts to wiring layers. That is, the break-down voltage is determined by only a combination of impurity densities of these regions which is selected to form desired ohmic contacts. The impurity density of the N+-type semicondutor region 44 as well as the impurity density of the P+-type semiconductor region 45 is selected to form ohmic contacts with the input wiring layer 3 and the reference potential wiring layer 13, respectively.

Therefore, there is a limitation in setting clamp level and it may be impossible to set it to a desired high value. Thus, it is impossible to set clamp level at various levels suitable for various semiconductor integrated circuits, resulting in reduced freedom in designing and manufacturing a semiconductor integrated circuit.

As another conventional technique related to such input protective circuit, FIG. 2 shows an example in which elements within a semiconductor integrated circuit to be protected and protective diodes are formed in a common semiconductor region of a semiconductor substrate. Such semiconductor integrated circuit is disclosed in, for example, Japanese Patent No. Sho 60-56310.

In FIG. 2, a semiconductor integrated circuit is constructed in a P-type well 62 which is one of semiconductor regions of a semiconductor substrate 61. That is, both an field effect transistor (FET) 60 to be protected against abnormal high voltage applied to an input bonding pad 2 and a protective diode 66 for protecting the FET 60 are provided in the same well 62. The FET 60 is constituted with an N+-type source region 63 connected to a reference voltage wiring layer 13 for providing Vss or GND, an N+-type drain region 64 for sending an output signal of the FET 60 to elements of a subsequent stage, a gate insulating film 68 on a channel region between these regions and a gate electrode 69 formed on the gate insulating film and connected to the input bonding pad 2 to receive an input signal. On the other hand, a P+-type semiconductor region 67 for forming an ohmic contact to which the reference voltage wiring layer 13 is connected and an N+-type semiconductor region 65 for forming the protective diode 66 which is connected to the input bonding pad 2 are formed in the P-type well 62.

In this semiconductor integrated circuit, the N+-type semiconductor region 65 is separated from the P+type semiconductor region 67 and the protective diode 66 is constituted by a PN junction 66 formed between the P-type well 62 and the N+-type semiconductor region 65. Therefore, its clamp level may higher than that of the circuit shown in FIG. 1. However, since impurity density of the P-type well 62 is determined by a characteristics of such as threshold voltage of the FET, break-down voltage, that is, clamp level of the protective diode 66 cannot be set to a desired value arbitrarily.

Break-down voltage of a clamp diode in such conventional protective circuit depends upon only impurity densities of regions constituting the clamp diode and, therefore, it is very difficult to apply it to a case where semiconductor integrated circuits to be protected require various clamp levels.

SUMMARY OF THE INVENTION

Therefore, an object of the present invention is to provide a semiconductor integrated circuit device having an input protective circuit including a diode, in which any of a variety of clamp levels (break-down voltages) can be set freely.

According to one aspect of the present invention, there is provided a semiconductor integrated circuit device comprising a semiconductor integrated circuit provided in a first portion of a semiconductor substrate, an input bonding pad provided in a second portion of the semiconductor substrate, an input wiring layer for connecting the input bonding pad to the semiconductor integrated circuit, a reference potential wiring layer for supplying reference potential to the semiconductor integrated circuit, and an input protective circuit provided in a third portion of the semiconductor substrate and coupled between the input wiring layer and the reference potential wiring layer for clamping an abnormal voltage supplied thereto through the input bonding pad, the input protective circuit being constituted with a first semiconductor region of a first conductivity type, the first semiconductor region being of high impurity density and connected to the input wiring layer, a second semiconductor region of a second conductivity type, the second semiconductor region being of high impurity density and connected to the reference potential wiring layer, and an electric field intensity relaxing region of low impurity density provided between the first semiconductor region and the second semiconductor region and forming a PN junction together with either one of the first semiconductor region and the second semiconductor region for setting a clamp level. The electric field intensity relaxing region may be of the first conductivity type and its impurity density is lower than that of the first semiconductor region. In such case, the electric field intensity relaxing region forms a PN junction together with the second semiconductor region and constitutes input protective diodes between the first semiconductor region and the second semiconductor region. Alternatively, the electric field intensity relaxing region may be of the second conductivity type and have an impurity density lower than that of the second semiconductor region. In such case, the electric field intensity relaxing region forms a PN junction together with the first semiconductor region to provide an input protective diode between the first semiconductor region and the second semiconductor region. It is preferable that the first and second semiconductor regions are separated from each other by 1-10 μm and the electric field intensity relaxing region fills a region therebetween. Further, it is preferable that the input protective circuit includes a third semiconductor region of the first conductivity type, which is connected to the reference potential wiring layer and serves to absorb break-down current generated by break-down of the PN junction when abnormal voltage from the input bonding pad is clamped.

According to another aspect of the present invention, there is provided a semiconductor integrated circuit device comprising a semiconductor integrated circuit provided in a first portion of a semiconductor substrate, an input bonding pad provided in a second portion of the semiconductor substrate, an input wiring layer for connecting the input bonding pad to the semiconductor integrated circuit, a reference potential wiring layer for supplying reference potential to the semiconductor integrated circuit, and an input protective circuit provided in a third portion of the semiconductor substrate and coupled between the input wiring layer and the reference potential wiring layer for clamping an abnormal voltage from the input bonding pad, the input protective circuit being constituted with a first semiconductor region of a first conductivity type which is connected to the input wiring layer, an electric field intensity relaxing region of the first conductivity type and of lower impurity density than that of the first semiconductor region, the electric field intensity relaxing region being preferably 1-10 μm wide and surrounding at least three sides of the first semiconductor region, a second semiconductor region of a second conductivity type which is connected to the reference potential wiring layer and forms a PN junction together with the electric field intensity relaxing region and surrounds at least three sides of the electric field intensity relaxing region, and a third semiconductor region of the first conductivity type which is connected to the reference potential wiring layer and surrounds at least three sides of the second semiconductor region, the electric field intensity relaxing region being used to set a clamp level and the third semiconductor region serving to absorb break-down current generated by break-down between the first and second semiconductor regions when abnormal voltage from the input bonding pad is clamped.

A further aspect of the present invention resides in that, in a semiconductor integrated circuit device including a semiconductor integrated circuit provided in a first portion of a semiconductor substrate, an input bonding pad provided in a second portion of the semiconductor substrate, an input wiring layer for connecting the input bonding pad to the semiconductor integrated circuit, a reference potential wiring layer for supplying reference potential to the semiconductor integrated circuit and an input protective circuit provided in a third portion of the semiconductor substrate and coupled between the input wiring layer and the reference potential wiring layer for clamping an abnormal voltage from the input bonding pad, the input protective circuit is constituted with a first semiconductor region of a first conductivity type which is connected to the input wiring layer, an electric field intensity relaxing region of the second conductivity type, the electric field intensity relaxing region preferably 1-10 μm wide surrounding at least three sides of the first semiconductor region to form a PN junction together therewith, a second semiconductor region of a second conductivity type which is of higher impurity density than that of the electric field intensity relaxing region, is connected to the reference potential wiring layer and surrounds at least three sides of the electric field intensity relaxing region and a third semiconductor region of the first conductivity type which is connected to the reference potential wiring layer and surrounds at least three sides of the second semiconductor region. The electric field intensity relaxing region is used to set a clamp level and the third semiconductor region serves to absorb break-down current generated by break-down between the first and second semiconductor regions when abnormal voltage from the input bonding pad is clamped.

BRIEF DESCRIPTION OF THE DRAWING

The above-mentioned and other objects, features and advantages of the present invention will become more apparent by reference to the following detailed description of the present invention taken in conjunction with the accompanying drawing, wherein.

DETAILED DESCRIPTION OF THE PREFERRED EMBODIMENTS

Figure 3:
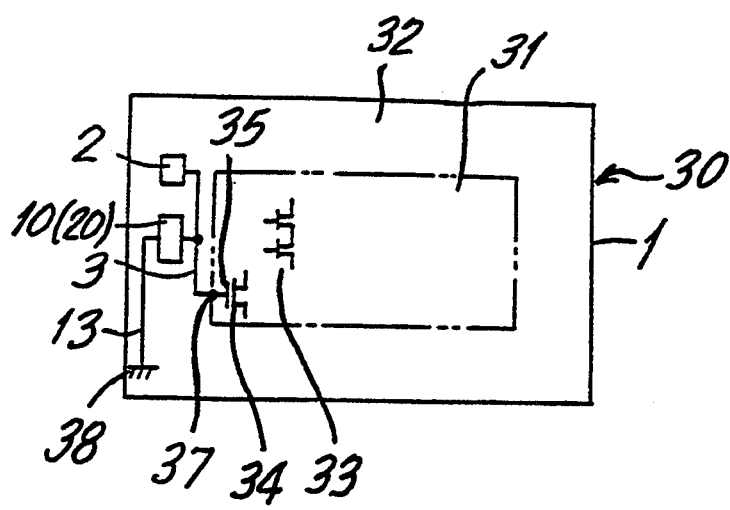
FIG. 3 is a plan view of a semiconductor integrated circuit device according to an embodiment of the present invention.

FIG. 3 shows schematically in plan view a semiconductor integrated circuit device (semiconductor chip) 30 according to an embodiment of the present invention. In FIG. 3, a semiconductor integrated circuit 33 is formed in a center portion 31 of a semiconductor substrate 1 and an input bonding pad 2 and an input protective circuit 10 (20) of the present invention are formed in respective portions in a peripheral portion 32 of the semiconductor substrate. An input wiring layer 3 is formed between the input bonding pad 2 and the semiconductor circuit 33 to connect them. A reference potential wiring layer 13 for supplying a reference potential of the semiconductor integrated circuit 33 is also formed on the semiconductor substrate 1 and connected to a reference potential terminal 38 such as ground terminal. The input protective circuit 10 (20) is coupled between the reference potential wiring layer 13 and the input wiring layer 3.

The semiconductor circuit 33 includes an element 34 to be protected. The element 34 may be a CCD when the semiconductor integrated circuit device 30 is a solid state image pick-up device or it may be a MOS type FET when the device 30 is other than such image pick-up device. Regardless of the type of the element 34, CCD or MOS type FET, its channel region becomes conductive by applying a clock signal or information signal of positive voltage of a normal level to a gate electrode 35 connected to an input node 37 of the element 34. However, since a gate insulating film below the gate electrode is as thin as several tens nm, such input protective circuit 10 (20) must protect against abnormal high voltage accidentally applied externally to the input bonding pad 2.

Figure 4A:
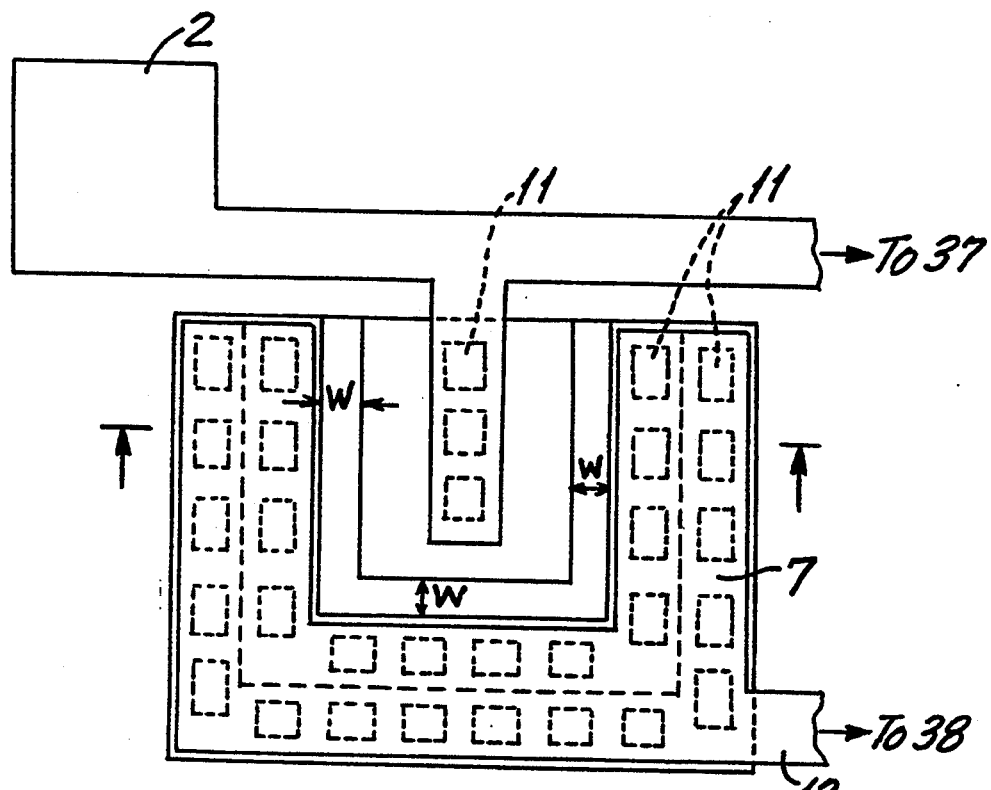
FIG. 4A is a plan view of an input protective circuit according to a first embodiment of the present invention.
Figure 4B:
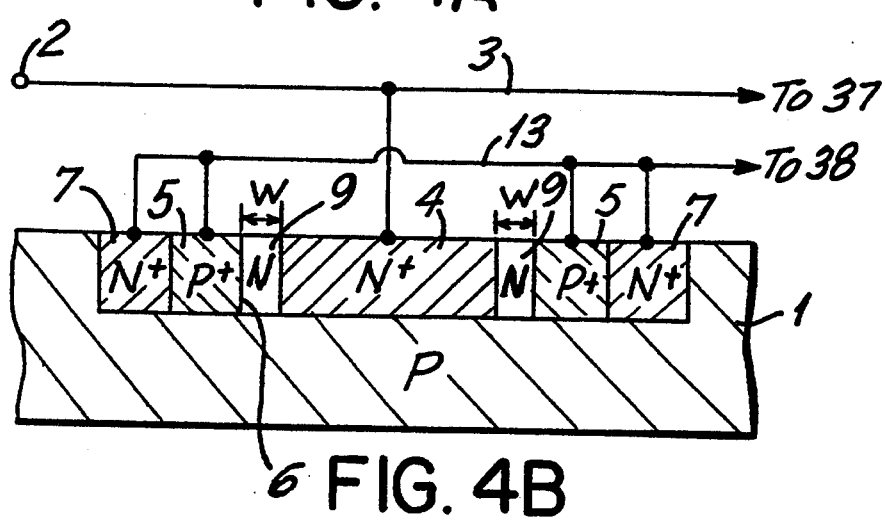
FIG. 4B is a cross section taken along a line B—B in FIG. 4A together with some circuit portion.

Referring to FIGS. 4A and 4B, there is shown the protective circuit 10 according to a first embodiment of the present invention. In these figures, the input wiring layer 3 connecting the input bonding pad 2 to the input node 37 of the semiconductor integrated circuit is formed of aluminum as an extension of the input bonding pad 2 and the reference potential wiring layer 13 of aluminum is also formed to supply a reference potential to a reference potential terminal 38.

The input protective circuit 10 connected between the input wiring layer 3 and the reference potential wiring layer 13 for clamping abnormal voltage applied from the input bonding pad 2 includes an N+-type semiconductor region 4 having impurity density (peak density) of $5 \times 10^{21}/cm^3$ and connected through a plurality of contact holes 11 provided in an insulating film (not shown) to a branching portion of the input wiring layer 3, an N type electric field intensity relaxing region 9 having width w of 3 $\mu$m and impurity density (peak density) of $5 \times 10^{17}/cm^3$ which is lower than that of the region 4 and surrounding at least three sides of the N+-type semiconductor region 4, a P+-type semiconductor region 5 having impurity density (peak density) of $1 \times 10^{19}/cm^3$ which surrounds at least three sides of the region 9 to form a PN junction 6 together therewith and is connected through a plurality of contact holes 11 provided in an insulating film (not shown) to a branching portion of the reference potential wiring layer 13 and N+-type semiconductor region 7 of impurity density of $5 \times 10^{19}/cm^3$ which is connected through a plurality of contact holes 11 to the reference potential wiring layer 13 and surrounds at least three sides of the P+-type semiconductor region 5.

Figure 4C:
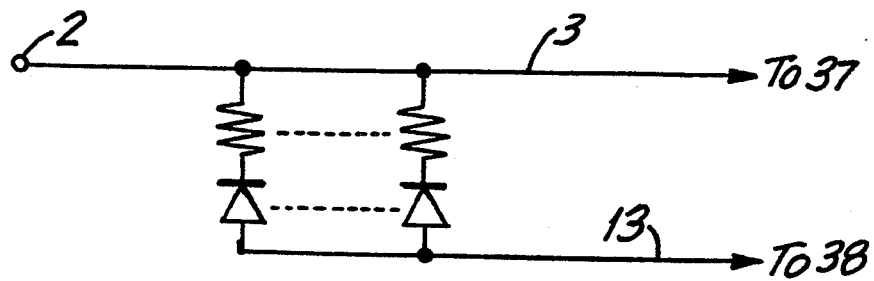
FIG. 4C is a circuit diagram of an equivalent circuit of the input protective circuit shown in FIG. 4A.

The input protective circuit 10 constructed as mentioned above takes in the form of a parallel connection of series circuits each including a protective diode 6' formed between the N+-type semiconductor region 4 and the P+-type semiconductor region 5 and a resistive element 12 formed within the N-type electric field intensity relaxing region 9 and is connected between the input wiring layer 3 and the reference potential wiring layer 13, as shown by an equivalent circuit in FIG. 4C. The fact that break-down voltage of the protective diode 6' is determined by an effect of depletion layer within the PN junction 6 and the N type electric field intensity relaxing region 9 is one of the features of the present invention.

The protective diode 6' is broken-down by abnormal voltage from the input bonding pad and an input voltage of the input node 37 of the semiconductor integrated circuit 33 is clamped by this break-down voltage, so that the element 34 (FIG. 3) is protected.

Therefore, since the N-type electric field intensity relaxing region 9 of this embodiment has no relation to ohmic contact as mentioned, it is possible to set impurity density of the electric field intensity relaxing region to a low value suitable for a reguired high clamp level. Further, due to such low impurity density of the N-type electric field intensity relaxing region 9, it is possible to form the resistive element 12 which functions as a limiter after break-down of the diode 6'. Since, in an actual device, a value of the resistive element 12 is preferably about 50 Ω, it is possible to determine impurity density and configuration of the N-type electric field intensity relaxing region 9 such that both a predetermined break-down voltage and such resistance value can be obtained.

On the other hand, the N+-type semiconductor region 7 serves to effectively absorb break-down current generated by the break-down of the diode 6'. That is, hot holes generated by the break-down are absorbed by the P+-type semiconductor region 5 and flow into the reference potential wiring layer 13. Since, according to the present invention, hot electrons are absorbed by the N+-type semiconductor region 7 and flow into the reference potential wiring 13, it is possible to avoid unstableness of operation of the semiconductor integrated circuit 33 (FIG. 3) due to hot electrons straying and spreading in the substrate.

An effect of the electric field intensity relaxing region 5 will be described. The role of the N-type electric field intensity relaxing region 9 is to make the break-down voltage (clamp level) possible to be set arbitrarily by not using the break-down voltage between the N type electric field intensity relaxing region 9 and the P+-type semiconductor region 5 but shifting effective break-down voltage between the N+-type semiconductor region 4 and the P+-type semiconductor region 5 by relaxing electric field intensity between the N+-type semiconductor region 4 and the P+-type semiconductor region 5. That is, when an excessive positive voltage is applied to the input bonding pad 2, the PN junction 6 is reverse-biased and the depletion layer extending therefrom through the electric field intensity relaxing region reaches the N+-type semiconductor region 4, causing the break-down phenomenon to occur.

Since the break-down voltage depends upon condition of the depletion layer reaching the N+-type semiconductor region 4, the break-down voltage is determined by impurity density of the electric field intensity relaxing region 9 and the width w of the region 9, that is, distance between the N+-type semiconductor region 4 and the P+-type semiconductor region 5.

Therefore, by providing the electric field intensity relaxing region 9, it is possible to set a plurality of arbitrarily selected break-down voltages on the same semiconductor chip without increase of process steps by using the distance w between the N+-type semiconductor region 4 and the P+-type semiconductor region 5 as a parameter. It should be noted that the larger the width w is the higher the break-down voltage. On the other hand, when a certain high break-down voltage is to be obtained by increasing the width w, it is necessary to reduce the impurity density of the electric field intensity relaxing region.

In actually designing a semiconductor integrated circuit device, it is preferable to set impurity density of the electric field intensity relaxing region to a predetermined value within a range from $1 \times 10^{17}/cm^3$ to $1 \times 10^{18}/cm^3$ and then to determine the width w such that a predetermined break-down voltage is obtained.

In the first embodiment described, break-down voltage of 37.5 V is obtained by setting impurity density of the electric field intensity relaxing region 9 to $5 \times 10^{17}/cm^3$ and its width w to 3 $\mu$m.

Figure 1A:
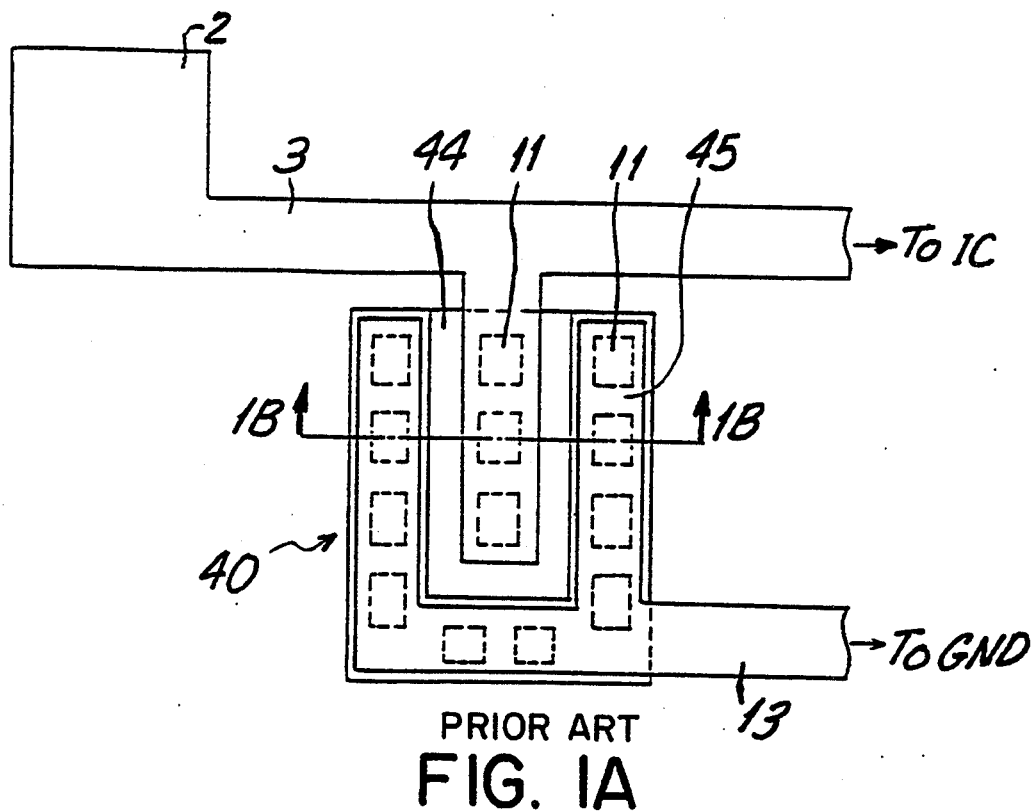
FIG. 1A is a plan view of a conventional input protective circuit of a semiconductor integrated circuit device.
Figure 1B:
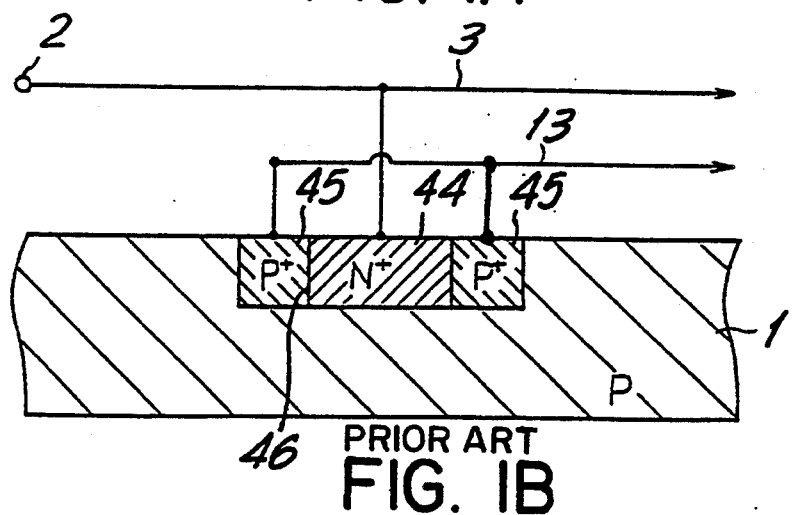
FIG. 1B is a cross section taken along a line B—B in FIG. 1A together with some circuit portion.
Figure 1C:
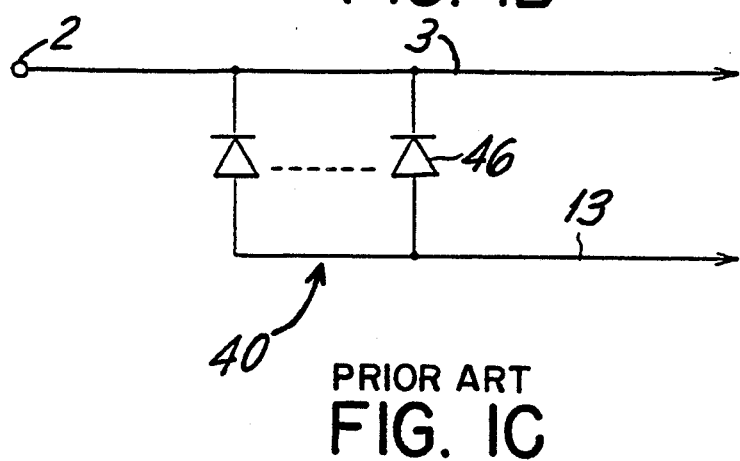
FIG. 1C is a circuit diagram of an equivalent circuit of the input protective circuit shown in FIG. 1A.
Figure 5:
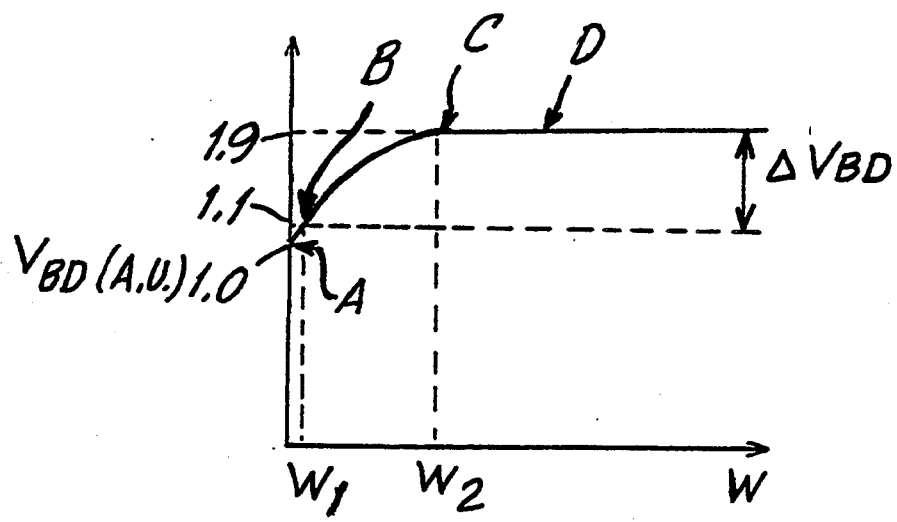
FIG. 5 is a graph showing a relation between width w of an electric field strength relaxing region 9 (distance between a first and second semiconductor regions) in the input protective circuit of the first embodiment and break-down voltage V.

FIG. 5 shows a relation between break-down voltage and width w of the electric field intensity relaxing region, where break-down voltage is indicated by arbitrary unit [A.U.]. $V_{BD}$ at point A at which width w is zero corresponds to the conventional device shown in FIGS. 1A to 1C. $V_{BD}$ from point B at which w is $w_1$ to point C at which w is $w_2$ is within a transition region in which a range of $\Delta V_{BD}$ can be changed by changing w. The break-down voltage, that is, clamp level, of the input protective circuit can be set arbitrarily within this transition range. For example, assuming that point A corresponds to 25 V, point B to 27.5 V and point C to 47.5 V, break-down voltage can be changed throughout the range of 20 V corresponding to a range between the points B and C by changing the width w within a range from $w_1$ to $w_2$. The lower limit of the width w, $w_1$, with which break-down voltage can be changed depends upon lithographic technology including doping and diffusing impurity and is 1 $\mu$m according to the current level of such technology. On the other hand, the upper limit of the width w of the electric field intensity relaxing region, $w_2$, with which break-down voltage can be changed depends upon impurity density, of thereof and, for a case where the impurity density is $1 \times 10^{17}/cm^3$ which is the minimum density within a range selectable in actually designing the above-mentioned device, $w_2$ becomes 10 $\mu$m. The higher the impurity density is the smaller the width $w_2$. When the impurity density is $5 \times 10^{17}/cm^3$ as in the first embodiment, $w_2$ becomes 8 $\mu$m.

Figure 2:
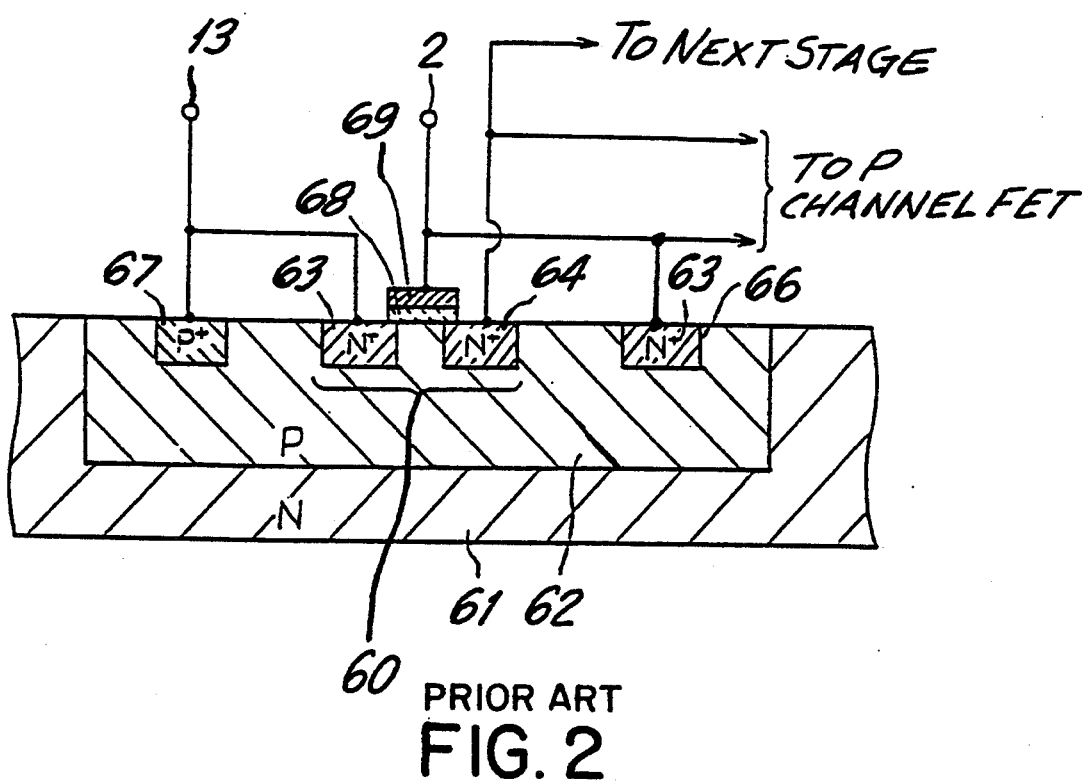
FIG. 2 is a cross section of another conventional input protective circuit together with some circuit portion thereof.

A region D in which the width w is larger than $w_2$ is a saturation region in which a break-down occurs between the N-type electric field intensity relaxing region 9 and the P+-type semiconductor region 5 before the depletion layer extending from the PN junction 6 between the N-type electric field intensity relaxing region 9 and the P+-type semiconductor region 5 reaches the N+-type semiconductor region 4. In this case, the N+-type semiconductor region 4 acts as a mere ohmic contact region and $V_{BD}$ is independent from w and a usual break-down voltage of the PN junction which depends upon only impurity densities of the N-type electric field intensity relaxing region 9 and the P+-type semiconductor region 5. The protective diode 66 in FIG. 2 corresponds to this region D although conductivity types are reversed.

Figure 6A:
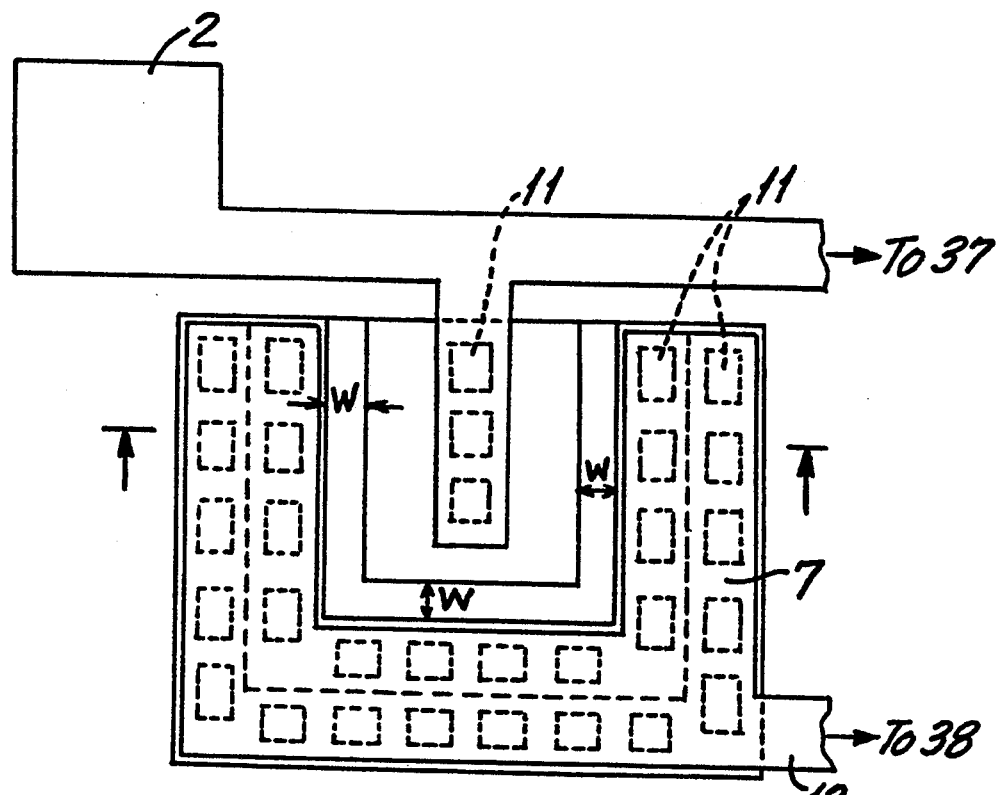
FIG. 6A is a plan view of an input protective circuit according to a second embodiment of the present invention.
Figure 6B:
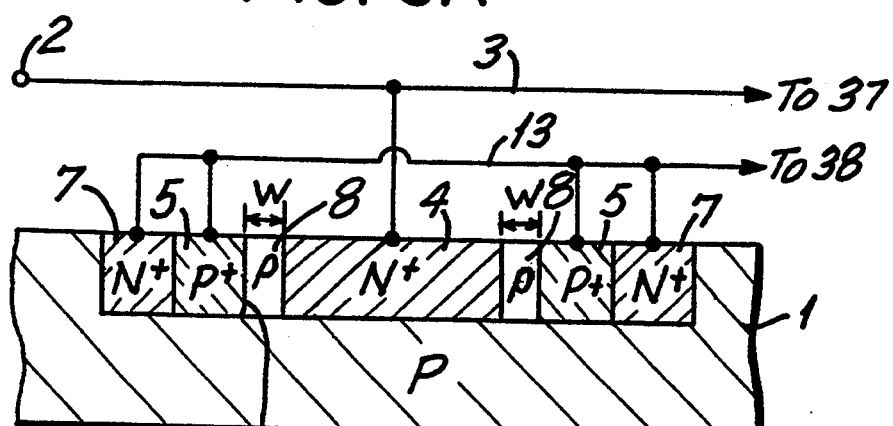
FIG. 6B is a cross section taken along a line B—B in FIG. 6A together with some circuit portion.
Figure 6C:
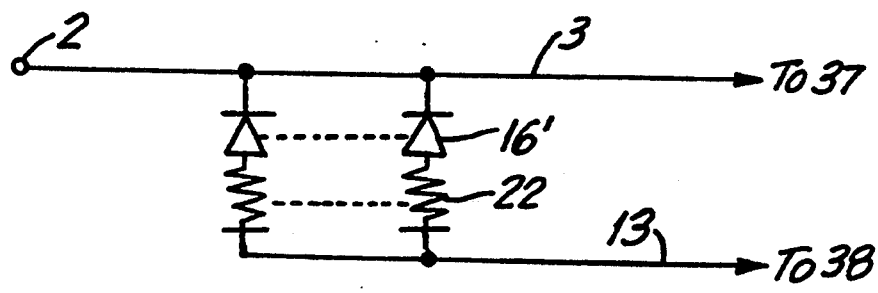
FIG. 6C is a circuit diagram of an equivalent circuit of the input protective circuit shown in FIG. 6A.

FIGS. 6A to 6C show a protective circuit 20 according to a second embodiment of the present invention. In these figures, same or similar portions as those in FIGS. 4A to 4C are depicted by same reference numerals, respectively, without detailed description thereof for avoidance of duplication.

The protective circuit 20 differs from that shown in FIGS. 4A to 4C in that a P-type electric field intensity relaxing region 8 is used as a region for setting the clamp level, instead of the N-type electric field intensity relaxing region 9. The effect of the P-type electric field intensity relaxing region 8 is the same as that of the region 9. That is, a PN junction 16 is formed between the P-type electric field intensity relaxing region 8 and an N+-type semiconductor region 4 and break-down voltage of a protective diode 16' formed between an N+-type semiconductor region 4 and a P+-type semiconductor region 5 is determined by condition of a depletion layer extending from the PN junction 16 through the P-type electric field intensity relaxing region 8 reaching the P+-type semiconductor region 5. A resistive element 22 formed in the P-type electric field intensity relaxing region 8 as a limiter is inserted into between the protective diode 16' and a reference potential wiring layer 13. The same effect as that of the first embodiment can be obtained in the second embodiment.

Although the first and second embodiments have been described as the input protective circuits formed on the P-type semiconductor substrates, respectively, the present invention is also applicable to an input protective circuit formed in an N type semiconductor substrate, an input protective circuit formed in a P-type or N-tyOe well layer formed in a P-type semiconductor substrate or an input protective circuit formed in a P-type or N-type well layer formed in an N-type semiconductor substrate. Further, the present invention is applicable to an input protective circuit connected to an input bonding pad through a resistance of polysilicon or diffusion layer.

As described hereinbefore, according to the present invention in which the diode of the input protective circuit is provided by the PN junction (6 or 16) by forming the electric field intensity relaxing region (9 or 8), it is possible to set a clamp level to a value suitable for a specific semiconductor integrated circuit arbitrarily by merely selecting the width w of the electric field strength relaxing region. Therefore, the present invention is particularly suitable for a solid state image pick-up device which requires various clamp levels. Further, according to the present invention, the undesired effect of invasion of hot electron of break-down current generated by break-down of the PN junction into the semiconductor integrated circuit formed in the semiconductor substrate can be prevented by forming, in the vicinity of the PN junction (6 or 16), the N+-type semiconductor region (7) connected to the reference potential wiring layer (13).

Although the present invention has been described with reference to specific embodiments, this description is not meant to be construed in a limiting sense. Various modifications of the disclosed embodiments, as well as other embodiments of the present invention, will become apparent to persons skilled in the art upon reference to the description of the present invention. It is, therefore, contemplated that the appended claims will cover any modifications or embodiments within the true scope of the present invention.

What is claimed is:

1. An input protective circuit for a semiconductor integrated circuit device having a semiconductor integrated circuit provided in a first portion of a semiconductor substrate, an input bonding pad provided on a second portion of said semiconductor substrate, an input wiring layer for connecting said input bonding pad to said semiconductor integrated circuit, a reference potential wiring layer for supplying a reference potential to said semiconductor integrated circuit, said input protective circuit being provided in a third portion of said semiconductor substrate and coupled between said input wiring layer and said reference potential wiring layer for clamping an abnormal voltage from said input bonding pad, said input protective circuit comprising:
   a first semiconductor region of a first conductivity type, said first semiconductor region being of high impurity density and connected to said input wiring layer;
   a second semiconductor region of a second conductivity type formed apart from said first semiconductor region, said second semiconductor region being of high impurity density and connected to said reference potential wiring layer; and
   an electric field intensity relaxing region of low impurity density formed between said first and second semiconductor regions in contact with said first semiconductor region and further with said second semiconductor region, said electric field intensity relaxing region having one of said first and second conductivity types to form a PN junction with one of said first and second semiconductor regions, and said electric field intensity relaxing region allowing a depletion layer extending from said PN junction to reach the other of said first and second semiconductor regions through said electric field intensity relaxing region when said abnormal voltage is applied to said input bonding pad so that a breakdown phenomenon occurs between said first and second semiconductor regions to clamp said abnormal voltage.

2. The input protective circuit for a semiconductor integrated device as claimed in claim 1, wherein said electric field intensity relaxing region is of the first conductivity type and of impurity density lower than that of said first semiconductor region and forms said PN junction together with said second semiconductor region to form an input protective diode between said first semiconductor region and said second semiconductor region.

3. The protective circuit as claimed in claim 1, wherein said electric field intensity relaxing region is of the second conductivity type and of impurity density lower than that of said second semiconductor region and forms said PN junction together with said first semiconductor region to form an input protective diode between said first semiconductor region and said second semiconductor region.

4. The protectived circuit as claimed in claim 1, wherein said first semiconductor region and said second semiconductor region are separated from each other 1-10 lm and said electric field intensity relaxing region fills a region therebetween.

5. The protective circuit as claimed in claim 1, wherein said electric field intensity relaxing region has a function of a resistive element.

6. The input protective circuit for a semiconductor integrated circuit device as claimed in claim 5, wherein a resistance of said electric field intensity relaxing region between said first semiconductor region and said second semiconductor region is about 50 Ω.

7. The input protective circuit for a semiconductor integrated circuit device as claimed in claim 1, wherein said input protective circuit further includes a third semiconductor region of the first conductivity type for absorbing break-down current generated by breakdown of said PN junction when abnormal voltage from said input bonding pad is clamped and said third semiconductor region is connected, together with said second semiconductor region, to said reference potential wiring layer.

8. An input protective circuit for a semiconductor integrated circuit device having a semiconductor integrated circuit provided in a first portion of a semiconductor substrate, an input bonding pad provided on a second portion of said semiconductor substrate, an input wiring layer for connecting said input bonding pad to said semiconductor integrated circuit, a reference potential wiring layer for supplying a reference potential to said semiconductor integrated circuit, said input protective circuit being provided in a third portion of said semiconductor substrate and coupled between said input wiring layer and said reference potential wiring layer for clamping an abnormal voltage from said input bonding pad, said input protective circuit comprising:
   a first semiconductor region of a first conductivity type connected to said input wiring layer and having a first impurity density;
   a second semiconductor region of a second conductivity type formed apart from said first semiconductor region and connected to said reference potential wiring layer, said semiconductor region having a first portion facing said first semiconductor region and a second portion opposite to said first portion;

an electric field relaxing region of the first conductivity type formed between said first and second semiconductor regions with a second impurity density lower than said first impurity density, said electric field relaxing region being in contact with said first semiconductor region and further with said first portion of said second semiconductor region to form a PN junction therewith, and said electric field relaxing region allowing a depletion layer extending from said PN junction to reach said first semiconductor region through said electric field relaxing region when said abnormal voltage is applied to said input bonding pad, a break-down phenomenon occurring between said first and second semiconductor regions to clamp said abnormal voltage; and a third semiconductor region of the first conductivity type formed in contact with said second portion of said second semiconductor region and connected to said reference potential wiring layer, said third semiconductor region absorbing hot carriers generated by said break-down phenomenon and transferring said hot carriers to said reference potential wiring layer.

9. The input protective circuit for a semiconductor integrated circuit as claimed in claim 8, wherein said electric field intensity relaxing region is 1 to 10 μm wide and surrounds said first semiconductor region.

10. An input protective circuit for a semiconductor integrated circuit device having a semiconductor integrated circuit provided in a first portion of a semiconductor substrate, an input bonding pad provided on a second portion of said semiconductor substrate, an input wiring layer for connecting said input bonding pad to said semiconductor integrated circuit, a reference potential wiring layer for supplying a reference potential to said semiconductor integrated circuit, said input protective circuit being provided in a third portion of said semiconductor substrate and coupled between said input wiring layer and said reference potential wiring layer for clamping an abnormal voltage from said input bonding pad, said input protective circuit comprising:

a first semiconductor region of a first conductivity type connected to said input wiring layer;

a second semiconductor region of a second conductivity type and of a first impurity density formed apart from said first semiconductor region and connected to said reference potential wiring layer, said second semiconductor region having a first portion facing with said first semiconductor region and a second portion facing opposite to said first portion;

an electric field relaxing region of the second conductivity type formed between said first and second semiconductor regions with a second impurity density lower than said first impurity density, said electric field relaxing region being in contact with said first semiconductor region to form a PN junction therewith and further with said first portion of said second semiconductor region, said electric field relaxing region allowing a depletion layer extending from said PN junction to reach said first semiconductor region through said electric field relaxing region when said abnormal voltage is applied to said input bonding pad, a break-down phenomenon occurring between said first and second semiconductor regions to clamp said abnormal voltage; and a third semiconductor region of the first conductivity type formed in contact with said second portion of said semiconductor region and connected to said reference potential wiring layer, said third semiconductor region absorbing hot carriers generated by said break-down phenomenon and transferring said hot carriers to said reference potential wiring layer.

11. The input protective circuit for a semiconductor integrated circuit device as claimed in claim 10, wherein said electric field intensity relaxing region is 1 to 10 μm wide and surrounds said first semiconductor region.

12. An integrated circuit device including an input protective circuit connected between an input bonding pad and a reference potential wiring layer to protect an internal circuit from an abnormal voltage applied to said input bonding pad, said input protective circuit comprising:

a semiconductor substrate of a first conductivity type having a first impurity concentration;

a first region of a second conductivity type formed in said semiconductor substrate to form a first PN junction therewith, said first region being connected to said input bonding pad and having a second impurity concentration;

a second region of said first conductivity type formed in said semiconductor substrate at a distance from said first region and connected to said reference potential wiring layer, said second region having a third impurity concentration higher than said first impurity concentration, said second region further having a first portion facing said first region and a second portion opposite to said first portion, and a third region formed between said first and second regions in contact with said first region and further with said first portion of said second region, said third region having a fourth impurity concentration that is lower than said second impurity concentration and said third impurity concentration, and having one of the first and second conductivity types to form a second PN junction with one of said first and second regions;

said distance between said first and second regions being designed such that said third region allows a depletion layer extending from said second PN junction to reach the other of said first and second regions through said third region when said abnormal voltage is applied to said input bonding pad, a break-down phenomenon occurring at said first PN junction.

13. The device as claimed in claim 12, further comprising a fourth region of the second conductivity type formed in said semiconductor substrate in contact with said second portion of said second region, said fourth region being connected to said reference potential wiring layer to absorb hot carriers generated by said breakdown phenomenon between said first and second regions and to transfer said hot carriers to said reference potential wiring layer.

14. The device as claimed in claim 13, wherein said third region is of the first conductivity type.

15. The device as claimed in claim 13, wherein said third region is of the second conductivity type.

16. The protective circuit as in claim 8, wherein said relaxing region surrounds at least three sides of said first semiconductor region, said second semiconductor region surrounds at least three sides of said relaxing region, and said third semiconductor region surrounds at least three sides of said second semiconductor region.

17. The protective circuit as in claim 10, wherein said relaxing region surrounds at least three sides of said first semiconductor region, said second semiconductor region surrounds at least three sides of said relaxing region, said third semiconductor region surrounding at least three sides of said second semiconductor region.

18. The protective circuit as in claim 13, wherein said first region is surrounded on at least three sides by said third region, said third region is surrounded on at least three sides by said second region and said second region is surrounded on at least three sides by said fourth region.

* * * * *